US005724429A

United States Patent [19]

Banerjea

[11] Patent Number: 5,724,429

[45] Date of Patent: Mar. 3, 1998

[54] SYSTEM AND METHOD FOR ENHANCING THE SPATIAL EFFECT OF SOUND PRODUCED BY A SOUND SYSTEM

[75] Inventor: Raja Banerjea, Tinton Falls, N.J.

[73] Assignee: Lucent Technologies Inc., Murray Hill, N.J.

[21] Appl. No.: 749,462

[22] Filed: Nov. 15, 1996

[51] Int. Cl.⁶ .................... H04S 1/00; H03G 3/00

[52] U.S. Cl. .................... 381/1; 381/63

[58] Field of Search .................... 381/1, 17, 18, 381/63

[56] References Cited

U.S. PATENT DOCUMENTS

| | | | |
|---|---|---|---|
| 3,560,656 | 2/1971 | Gilbert | 179/1 |
| 4,118,599 | 10/1978 | Iwahara et al. | 179/1 G |
| 4,329,544 | 5/1982 | Yamada | 179/1 VE |
| 4,394,536 | 7/1983 | Shima et al. | 179/1 G |
| 4,524,451 | 6/1985 | Watanabe | 381/1 |
| 4,586,417 | 5/1986 | Kato et al. | |
| 4,748,669 | 5/1988 | Klayman | 381/1 |
| 4,980,914 | 12/1990 | Kunugi et al. | 381/1 |
| 5,046,097 | 9/1991 | Lowe et al. | 381/17 |
| 5,095,507 | 3/1992 | Lowe | 381/17 |
| 5,105,462 | 4/1992 | Lowe et al. | 381/17 |
| 5,138,660 | 8/1992 | Lowe et al. | 381/17 |
| 5,208,860 | 5/1993 | Lowe et al. | 381/17 |
| 5,398,286 | 3/1995 | Balestri et al. | 381/94 |
| 5,412,731 | 5/1995 | Desper | 381/1 |
| 5,414,774 | 5/1995 | Yumoto | 381/1 |
| 5,438,623 | 8/1995 | Begault | 381/17 |
| 5,543,579 | 8/1996 | Morinaga et al. | 381/61 |

OTHER PUBLICATIONS

Begault, Durand R., "3-D Sound for Virtual Reality and Multimedia," Academic Press, Inc., 1994, pp. 20-22, 52-115, 117-245.

*Primary Examiner*—Forester W. Isen
*Attorney, Agent, or Firm*—Robert R. Axenfeld

[57] ABSTRACT

System and method for enhancing the spatial effect of sound produced by a sound system. In an exemplary embodiment, the system includes a reverberator and a sound spatialization unit, which are a combination of filter(s), attenuator(s), differentiator(s), adder(s) and phase shifter(s). The present invention creates sound images at different spatial locations for different frequencies by employing a phase shifted high frequency reverberated signal. As a result, the loud speakers produce sound images located at several spatial positions, producing a perception that there is an array of loudspeakers surrounding a listener.

18 Claims, 2 Drawing Sheets

SYSTEM AND METHOD FOR ENHANCING THE SPATIAL EFFECT OF SOUND PRODUCED BY A SOUND SYSTEM

FIELD OF THE INVENTION

The present invention relates generally to sound systems, and more specifically, to a system and method for enhancing the spatial effect of sound produced by the sound system.

BACKGROUND OF THE INVENTION

In most multimedia applications a personal computer employs small speakers that are placed close to one another. Typically, the speakers are located on either side of a monitor or are built into the monitor. Additionally, the listener is usually in close proximity to the speakers with the sound passing directly from the speakers to the listener with little opportunity for sound reflection. In other words, the reflected sound ratio is very large creating a directional sound field as opposed to a spatial sound field. Consequently, the sound produced by the speakers will be perceived by the listener from the left or right speaker with little to no spatial effect.

Attempts have been made to improve sound spatialization by attempting to widen the sound produced by a stereo system. For instance, U.S. Pat. No. 4,329,544 to Yamada (the '544 patent) and U.S. Pat. No. 4,394,536 to Shima et al. (the '536 patent) try to provide improved stereo systems with increased sound spatialization. The '544 patent appears to apply reverberation signals to left and right input stereo signals which are delayed according to the relative distance to each listener in an automobile. The '536 patent appears to show a way to produce a reverberation signal and add the reverberation signal to the stereo input signals. While both the '544 and '536 patents suggest adding reverberation signals to stereo input signals to improve sound spatialization, the schemes they describe do not necessarily improve the overall acoustic experience to the listener, because the changing directional components (high frequencies) are not isolated. Consequently, the listener does not hear the changing directional components in the sound signals. Moreover, neither patent teaches how to spatialize and improve the overall realistic listening experience of a listener by surrounding the listener with separate distinct images for each directional frequency associated with the stereo input signals while not modifying the non-varying directional frequencies (lower frequencies such as speech), where it is desired to have less of a spatialization effect.

What is needed, therefore, is a system and method to realistically enhance the spatial effect of sound produced by a sound system by surrounding the listener with an array of spatial images associated with different high-frequency components of the stereo signals so it seems to the listener that there is an array of speakers surrounding him or her.

SUMMARY OF THE INVENTION

The present invention is directed to a system and method for enhancing the spatial effect of sound produced by a sound system.

In one exemplary embodiment a stereo signal is received. A reverberation signal is generated and combined with the stereo signal to produce first and second reverberation signals. At least one of the first and second reverberation signals is split into high frequency and low frequency components. The high frequency component of at least the first and second reverberation signal is then phased shifted relative to the low frequency component of the first and/or second reverberation signal to produce at least one spatial sound signal. The spatial sound signal is applied to a transducer.

By employing a phase shifted high frequency reverberated signal, the present invention creates sound images at different spatial locations for different frequencies. Additionally, it appears to a listener that the sound images are being created from different positions creating a perception that there is an array of loudspeakers surrounding the listener.

Other features and advantages of the present invention will become apparent after reading the foregoing description.

In the figures, arrows between elements denote paths linking signals and/or information. Such paths may be a bus, wire, optic fiber and the like in hardware applications or a logical connection for the transfer of information in software applications or a combination in hybrid hardware/software systems.

DETAILED DESCRIPTION OF THE INVENTION

Figure 1:
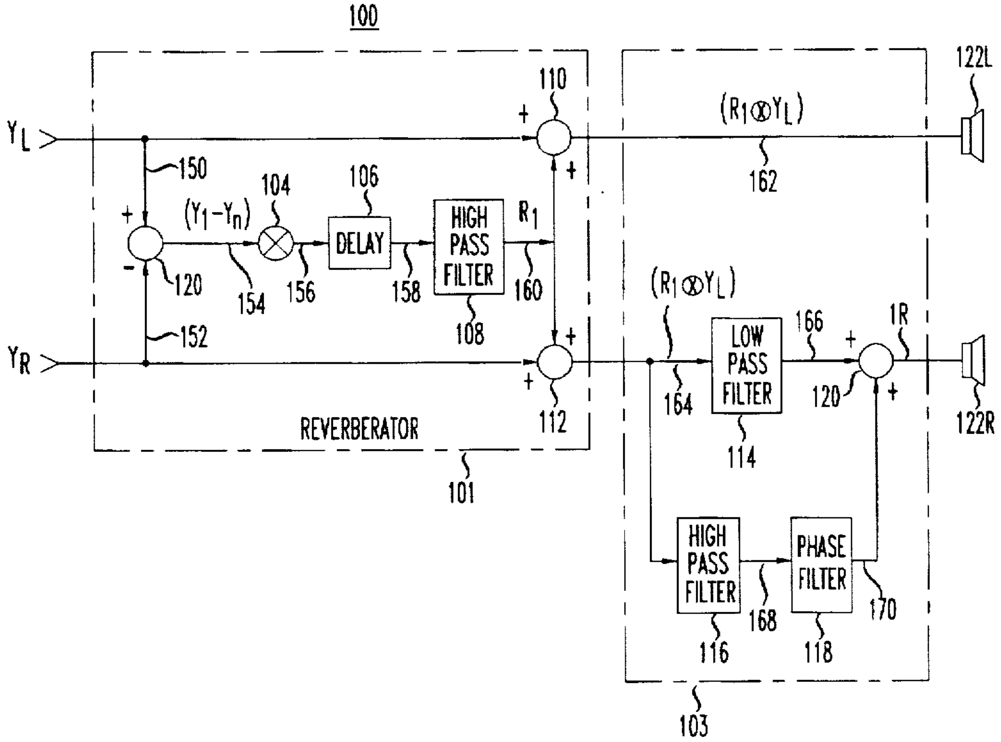
FIG. 1 is an exemplary embodiment of a sound system 100 according to the present invention.

FIG. 1 is an exemplary embodiment of a sound system 100 according to the present invention. The sound system 100 is a two channel system with left and right input signals $Y_L$ and $Y_R$ (collectively referred to as a stereo signal) and left and right loudspeakers 122L and 122R. Generally, the sound system 100 can be incorporated for use in many types of sound systems, (such as a movie theater systems, automobile stereos, home entertainment systems and so forth), to improve the spatial effect of the sound produced by such systems. More specifically, it is envisioned that the sound system 100 will be employed to improve sound quality of personal computers where speakers 122R and 122L are positioned in close proximity to the other.

The sound system 100 includes two stages: a reverberator 101 and a sound spatialization unit 103. The reverberator 101 includes a differentiator 102, adders 110, 112, an attenuator 104, a delay filter 106, and a high-pass filter 108. The sound spatialization unit 103 includes a low low-pass filter 114, a high-pass filter 116, a phase shifter 118 and an adder 120.

A more detailed description of sound system 100 (including elements 102–122) will be described below with reference to FIG. 2, which is a flow chart 200 showing the operation of sound system 100 in accordance with the present invention. Flow chart 200 includes blocks 202, 204, 206, 208, 210, and 212, which represent operational steps of the sound system 100.

Figure 2:
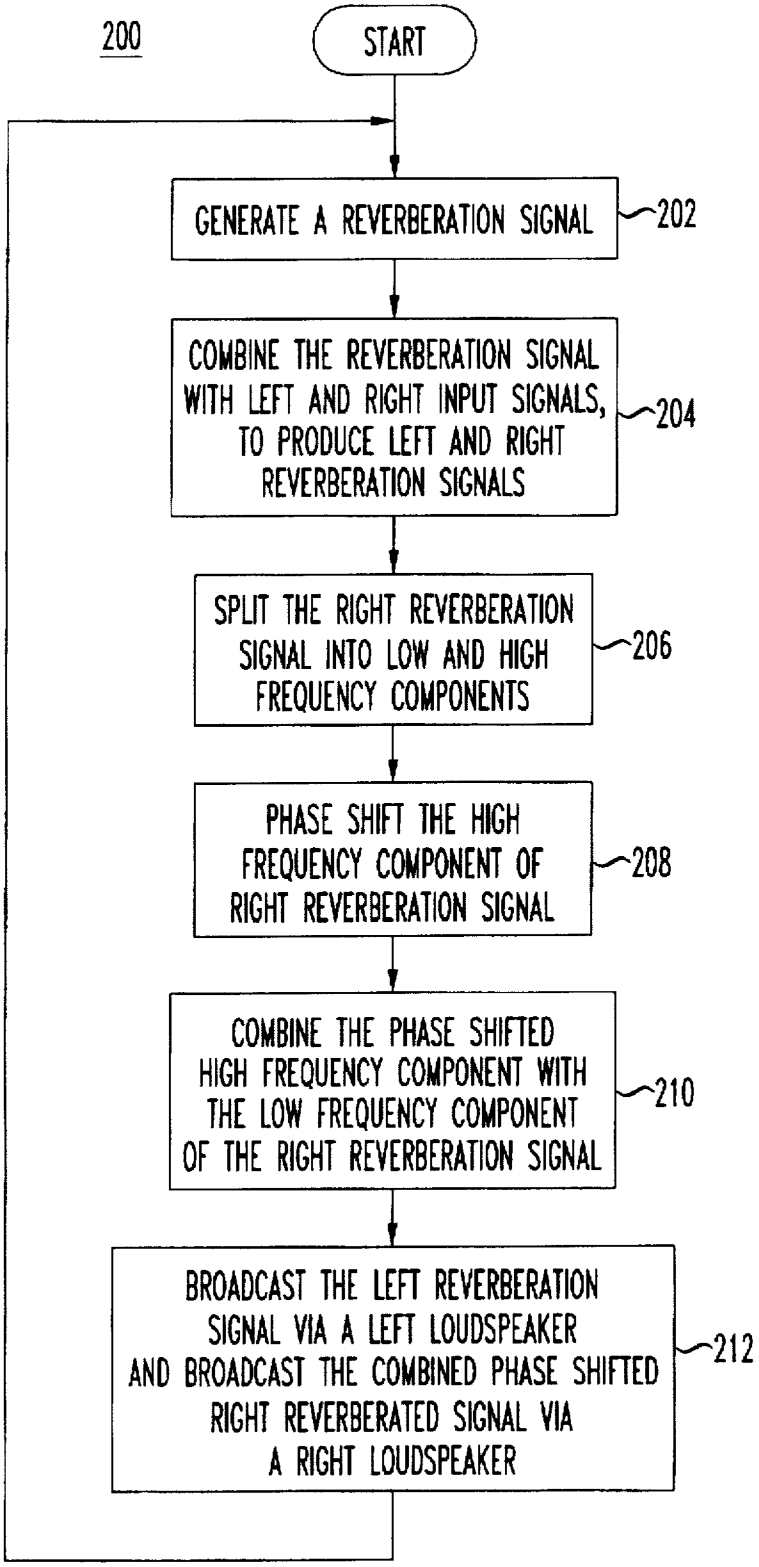
FIG. 2 is a flow chart 200 illustrating the operation of sound system 100 in accordance with the present invention.

Referring to FIG. 2, in step 202, the reverberator 101 generates a reverberation signal ($R_1$), which is shown in FIG. 1. This is accomplished as follows: the differentiator 102 generates a differential signal ($Y_L$–$Y_R$) indicative of differences between left $Y_L$ and right signals $Y_R$. Next, the attenuator 104 increases or decreases gain levels of the differential signal ($Y_L$–$Y_R$). It is envisioned that the gain can be dynamically adjusted by the listener to increase or decrease the amount of gain associated with reverberation.

Next, the delay filter 106 delays the differential signal $(Y_L - Y_R)$ by a factor $\alpha$, which is also envisioned to be adjustable by the listener. Finally, the lower frequency components of the differential signal $(Y_L - Y_R)$ are blocked by passing the differential signal $(Y_L - Y_R)$ through a high pass filter 108 to produce the reverberation signal $R_1$. The high-pass filter 108 helps to separate the higher frequency components of the input signals from the lower frequency components. Typically, it is desired to reverberate higher frequency input signals to aid in accentuating the spatial effect, because higher frequency signals tend to have a wider perceived image dimension than lower frequency signals, such as speech.

After the reverberator 101 generates a reverberation signal $(R_1)$, in step 204, adders 110 and 112 combine the reverberation signal $R_1$ with the left and right signals $Y_L$, and $Y_R$ to produce left and right reverberated signals $(R_1 \otimes Y_L)$ and $(R_1 \otimes Y_R)$, respectively. It is contemplated that the reverberation signal $R_1$ could be added to more input channels in the case of a system having more than two channel inputs or just to one channel (left or right) depending on the desired level of reverberation per channel. It is also possible to implement a reverberator in other ways. For a more general discussion of reverberators and reverberation see D. R. Begault, *3D Sound*, pages 184–187 Academic Press Inc., 1994, incorporated herein by reference.

Next, in step 206, the right reverberated signal $(R_1 \otimes Y_R)$ is split into high frequency and low frequency components by passing the right reverberated signal $(R_1 \otimes Y_R)$ through the high-pass filter 116 and low filter 114. For example, frequencies greater than 1K Hertz may be designated as the high frequency component, while frequencies below 1K Hertz may be designated as the low frequency component. Of course, the high and low frequency components can vary depending on the application. The high frequency component of the right reverberated signal $(R_1 \otimes Y_R)$ is then transferred via line 168 to phase shifter 118.

Next, in step 208, phase shifter 118 shifts the phase of the high frequency component of the right reverberated signal $(R_1 \otimes Y_R)$. Typically, high frequency components of the right reverberated signal $(R_1 \otimes Y_R)$ provide directional cues. Thus, by further isolating these frequencies and phase shifting them, the sound system 100 highlights the fast changing directional components of the input signal(s). The high-pass filter 116 removes slow moving effects in (e.g., the lower frequency components such as speech) of the right reverberated signal $(R_1 \otimes Y_R)$.

In steps 210 and 212, the phase shifted high-frequency component of the right reverberated signal $(R_1 \otimes Y_R)$ is combined with low frequency component by adder 120, transferred to speaker 122R via line 172 and transmitted to the listener. Simultaneously, the left reverberated signal $(R_1 \otimes L_R)$ is transferred to the left speaker 122L, via line 162, and transmitted to the listener. Consequently, it seems to the listener that there is an array of separate sound images at different spatial locations associated with varying frequency components. It also seems to the listener that there is an array of loudspeakers surrounding him or her providing an enriched listening experience. It is contemplated that the listener, via a control knob (not shown) connected to the low and high-pass filters 114, 116 will control a cut-off frequency of the filters to customize the amount of spatialization desired by the listener.

Although it is possible to phase shift the low frequency component as well as the high frequency component of the right and/or left reverberation signal $(Y_L/Y_R \otimes R_1)$ via the sound spatialization unit 103, it is not necessary because the low frequency component of the reverberation signal does not exhibit much directional information. Thus, in the exemplary embodiment of FIG. 1, the low frequency component is left unchanged. Additionally, while it is possible to duplicate phase shifting efforts (e.g., by 114, 116, 118) for the left channel (only the right channel is phased shifted in the exemplary embodiment), it is typically not necessary, because the possible maximum range of perceived spatialization to a listener is typically achieved though a single channel, phase shifting, high-pass/low-pass filter configuration (e.g., 114, 116, 118).

From the foregoing, it may be appreciated by those skilled in the art that the reverberator 101 and spatilization unit 103 can be implemented on an integrated circuit chip, in software, hardware, or a combination thereof. Additionally, in FIG. 1 for simplification and illustrative purposes, it should be appreciated that lines 162 and 172 may be connected directly as outputs to other elements associated with the transducers 122, such as amplifiers and buffers (not shown), but well understood by those skilled in the art.

While preferred embodiments have been set forth, various modifications, alterations, and changes may be made without departing from the spirit and scope of the present invention as defined in the specification and in the appended claims.

What is claimed is:

1. A sound system for enhancing the spatial effect of sound, comprising:
   - a reverberator, configured to receive a stereo signal and generate a reverberation signal;
   - a low-pass filter, coupled to said reverberator, configured to damp a high frequency component of said reverberation signal and produce a low frequency signal;
   - a high-pass filter, coupled to said reverberator, configured to damp a low frequency component of said reverberation signal and produce a high frequency signal;
   - a phase shifter, coupled to said high-pass filter, configured to phase shift said high frequency signal and produce a phase shifted high frequency signal; and
   - an adder, coupled to said low-pass filter and said phase shifter, configured to combine said low frequency signal with said phase shifted high frequency signal for output to a transducer.

2. The invention of claim 1, wherein said reverberator comprises:
   - means for producing a differential signal indicative of differences between left and right signals comprising said stereo signal,
   - means for delaying said differential signal; and
   - a high-pass filter, coupled to said delay means, for blocking frequencies of said differential signal below a certain frequency level; and
   - means for combining said differential signal to said stereo signal.

3. The invention of claim 2, further comprising an attenuator, coupled to said means for producing a differential signal, configured to increase or decrease gain levels of said differential signal.

4. The invention of claim 2, wherein said means for combining is an adder.

5. The invention of claim 1, wherein said phase shifter is configured to vary said phase of said phase shifted high frequency signal.

6. The invention of claim 1, wherein said sound system is implemented in an integrated circuit.

7. A sound reproduction system which extends the spatial field of sound produced by a stereo system, comprising:

a signal source for generating at least first and second input signals;

means for producing a difference signal equal to a difference between said first and second input signals;

means for delaying said difference signal;

first and second means for combining said difference signal with said first and second input signals, respectively, to produce first and second reverberated signals;

means, coupled to said first means, for passing a high frequency portion of said first reverberated signal;

a phase shifter, for varying a phase of said high frequency portion of said first reverberated signal;

means for combining said varied phase of said high frequency portion of said first reverberated signal with a low frequency portion of said first reverberated signal; and first and second output channels, wherein said first channel is configured to transfer said combined low frequency portion and phase varied high frequency portion of said first reverberated signal to a first loud speaker, and wherein said second output channel is configured to transfer said second reverberated signal to a second loud speaker.

8. The system of claim 7, further comprising means for attenuating said difference signal.

9. The system of claim 8, wherein said attenuation means is configured to be adjusted by a listener.

10. The system of claim 7, wherein a listener can select how much to vary said phase of said high frequency portion of said first reverberated signal.

11. In a sound system having left and right signals ($Y_L$, $Y_R$), a system for increasing the perceived spatial sound to a listener of said sound system, comprising:

a reverberator, coupled to said sound system, for receiving said signals $Y_L$ and $Y_R$ and producing a reverberation signal ($R_1$);

left and right adders, coupled to said host and reverberator, to combine said signals $R_1$ with $Y_L$ and $Y_R$, to produce signals ($R_1 \otimes Y_L$) and ($R_1 \otimes Y_R$), respectively;

means for separating low and high frequency portions of said ($R_1 \otimes Y_R$) signal to produce a low frequency ($R_1 \otimes Y_R$) signal and a high frequency ($R_1 \otimes Y_R$) signal;

means for phase shifting said high frequency ($R_1 \otimes Y_R$) signal to produce a phase shifted high frequency ($R_1 \otimes Y_R$) signal;

an adder, for combining said low frequency ($R_1 \otimes Y_R$) signal with said phase shifted high frequency ($R_1 \otimes Y_R$) signal; and means for transferring said ($R_1 \otimes Y_L$) signal and said combined low frequency and phase shifted ($R_1 \otimes Y_R$) signals to speakers.

12. The system of claim 11, wherein said transfer means comprises left and right wires, said left wire for transfer said ($R_1 \otimes Y_L$) signal and said right wire for transferring said combined low frequency and phase shifted ($R_1 \otimes Y_R$) signals.

13. The system of claim 11, wherein said sound system is a computer.

14. The system of claim 11, wherein said sound system is in a multimedia environment.

15. A method for increasing spatial sound produced by a sound system said method comprising the steps of:

receiving a stereo signal;

generating a reverberation signal;

combining said reverberation signal to said stereo signal to produce first and second reverberation signals;

splitting at least one of said first and second reverberation signals into a high frequency and low frequency component;

phase shifting said high frequency component of at least one of said first and second reverberation signals; and combining said low frequency component of at least said first and second reverberation signals with said phase shifted high frequency component of at least said first and second reverberation signals to produce at least one spatial sound signal; and applying said spatial sound signal to at least one loudspeaker.

16. The method of claim 15, wherein said step of generating a reverberation signal includes the steps of:

producing a differential signal indicative of differences between first and second channels of said stereo signal, delaying said differential signal; and selecting frequencies of said differential signal above a selected level.

17. The method of claim 15 further including the step of adjusting how much said high frequency component of said first and/or second reverberation signals is phase shifted.

18. A method for enhancing spatial sound produced by a sound system, said method comprising the steps of:

receiving a stereo signal generating a reverberation signal;

combining said reverberation signal to said stereo signal to produce left and right reverberation signals;

splitting said right reverberation signals into a high frequency and low frequency component;

shifting a phase of said high frequency component of said right reverberation signal; and combining said low frequency component with said phase shifted high frequency component of right reverberation signals to produce a spatial sound signal; and applying said left reverberation signal and said spatial sound signal to separate loudspeakers.

* * * * *